United States Patent
Berland et al.

[11] Patent Number: 4,718,163
[45] Date of Patent: Jan. 12, 1988

[54] PROCESS FOR PRODUCING COOLING DEVICE FOR PRINTED CIRCUIT CARD

[75] Inventors: Robert Berland; Bernard Dumont, both of Paris, France

[73] Assignee: Thomson-CSF, Paris, France

[21] Appl. No.: 880,100

[22] Filed: Jun. 30, 1986

Related U.S. Application Data

[60] Division of Ser. No. 780,798, Sep. 27, 1985, abandoned, which is a continuation of Ser. No. 430,386, Sep. 30, 1982, abandoned.

[30] Foreign Application Priority Data

Dec. 31, 1981 [FR] France .................. 81 24588

[51] Int. Cl.⁴ .................................. H05K 3/30
[52] U.S. Cl. ........................... 29/837; 29/832; 29/840; 174/16 HS; 361/382; 361/415
[58] Field of Search ............ 361/412, 415, 382, 383, 361/384-388; 174/16 HS, 15 HP; 357/81, 82; 165/104.33, 170; 29/830, 840, 832, 837

[56] References Cited

U.S. PATENT DOCUMENTS 3,916,434 10/1975 Garboushian .
3,936,866 2/1976 Grossman et al. .
4,037,270 7/1977 Ahmann et al. .
4,186,422 1/1980 Laermer .
4,396,936 8/1983 McIver et al. .
4,554,575 11/1985 Lucas .
4,617,586 10/1986 Cuvilliers et al. .

FOREIGN PATENT DOCUMENTS 1220370 1/1971 United Kingdom .

*Primary Examiner*—Howard N. Goldberg
*Assistant Examiner*—Carl J. Arbes
*Attorney, Agent, or Firm*—Cushman, Darby & Cushman

[57] ABSTRACT

The invention relates to a cooling device for a printed circuit card and to its production process.

It is constituted by a parallelepipedic copper frame, to one face of which is fixed the card. The frame is open on two opposite lateral faces orthogonal to the first face.

Copper partitions, orthogonal to the first face, define passages through which the liquid or gaseous cooling fluid flows. Gaps can be made orthogonally to the first face for the passage of the fastening clips of the components.

Application to printed circuit cards equipping airborne equipment.

8 Claims, 11 Drawing Figures

PROCESS FOR PRODUCING COOLING DEVICE FOR PRINTED CIRCUIT CARD

This is a division of application Ser. No. 780,798 filed Sept. 27, 1985 now abandoned which is a continuation of Ser. No. 430,386 filed Sept. 30, 1982 now abandoned.

BACKGROUND OF THE INVENTION

The present invention relates to a cooling device for a printed circuit card and to a process for producing such a device.

At present, two principles are known for cooling a printed circuit card. The first involves cooling by convection in the air, which suffers from the disadvantage of the risk of polluting the components and the printed circuit. The second involves cooling by conduction in a thermal drain formed in the thickness of the printed circuit card but this is particularly heavy and difficult to use in airborne equipment.

BRIEF SUMMARY OF THE INVENTION

The present invention aims at obviating the aforementioned disadvantages. It relates to a cooling device for a printed circuit card permitting an excellent heat dissipation.

It also relates to a cooling device usable in airborne equipment, because it does increase the weight of the latter and permits a volume gain.

Another object of the invention is a cooling device, which is not only usable for cards on which flat packaging components are installed, but also for cards on which integrated components in so-called dual-in-line or DIL packaging are installed.

It also relates to a particularly simple process for producing such a cooling device.

The present invention more specifically relates to a device for cooling a printed circuit card, wherein it comprises a parallelepipedic hollow copperframe having four lateral faces and two upper and lower faces, which is open on its two opposite lateral faces and within which a cooling fluid circulates between copper partitions orthogonal to the upper and lower faces, the printed circuit board being joined to one of the upper or lower faces of the said frame by the face not carrying the printed circuit.

BRIEF DESCRIPTION OF THE DRAWINGS

The invention is described in greater detail hereinafter relative to non-limiting embodiments and with reference to the attached drawings. The drawings show.

DETAILED DESCRIPTION OF THE PREFERRED EMBODIMENTS

Figure 1:
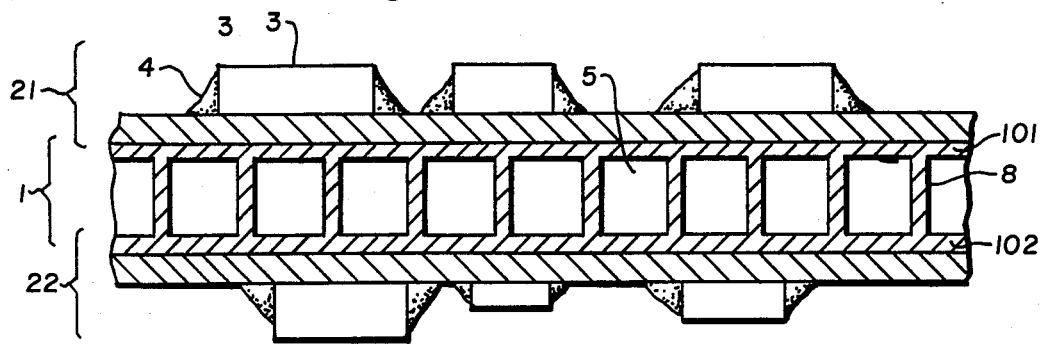
FIG. 1 a sectional view of an embodiment of the device according to the invention.

The present invention relates to a process for producing a cooling device for a printed circuit board as well as the device for cooling a printed circuit board.

The process for producing a cooling device for a printed circuit board comprises the following successive steps. First, a parallelepipedic core is molded. The core has four lateral faces as well as two upper and two lower faces. The core is made from a material having a melting point well below that of copper. Next, a copper coating is applied to the entire surface of the core by electroforming. The two lateral faces are then machined. The core is dissolved. The printed circuit board which will be cooled in the final device is thereafter fixed to an upper or lower face. The upper or lower face carrying the printed circuit board is turned outwardly. Finally, the components are thereafter installed on the printed circuit card.

In a further embodiment, the basic process also includes an additional step prior to the electroforming step wherein a plurality of copper partitions perpendicular to the upper and lower faces are incorporated in the core.

In a still further embodiment, gaps are made through the core curing the molding step but before the electroforming step. The gaps are orthogonal to the upper and lower faces of the core. The lateral walls are thereafter covered with copper during the electroforming step.

The device for cooling a printed circuit board comprises a paralleleppedic copper covered hollow frame. The hollow frame has four lateral faces and two upper and lower faces. The lateral frame is open on its two opposite lateral faces. Copper partitions are included which are positioned orthogonal to the upper and lower faces. A cooling medium can circulate through the hollow frame between the copper partitions. The printed circuit board(s) are joined to one of the upper or lower faces of the frame. The upper or lower face of the frame carrying the printed circuit board is the face not otherwise carrying a printed circuit.

In an additional embodiment, partitions in the cooling device extend in a continuous longitudinal manner between two open lateral faces. The partitions define parallelepipedic channels which are open at two ends. The channels have copper walls.

The cooling device may also have open gaps in the upper and lower faces of the frame. The gaps traverse the thickness of the frame. The side walls of the gaps are constituted by copper partitions and face the leads of the components which are to be installed.

The cooling device may also include flat packaging components installed on the face of the card which is turned outwardly.

In the cooling device according to the present invention, a component may be placed on the cooling device such that it is astride the channels which exist between the two gaps corresponding to the leads, from the other side of the device with respect to that of the printed circuit board. In use, the cooling liquid flows through the channels. The leads of the component traverse the thickness of the device through the gaps and the thickness of the board. The components extend through the perforations provided in the printed circuit board and are welded to the outwardly turned face of the printed circuit board.

The cooling fluid employed in the present invention may be a liquid or a gas.

FIG. 1 is a lateral sectional view of the device according to the invention, when the components used are in a flat packaging, The cooling device is designated by reference numeral 11. A printed circuit card 21 having on one face diagrammatically represented components 3, welded at 4, is fixed by its other face to the upper surface of the cooling device.

Another single-face printed circuit card 22 can, as in the embodiment of FIG. 1, be fixed to the lower surface of device 1.

In this particularly simple case of flat packaging components, i.e. which do not traverse the printed circuit card, the device 1 is a copper frame, whose two upper 101 and lower 102 faces, which are parallel, are connected by parallel transverse partitions 8 and form adjacent parallelepipedic channels 5.

An embodiment of such a frame is shown in FIGS. 4a to 4d and is described hereinafter with reference thereto.

Figure 2:
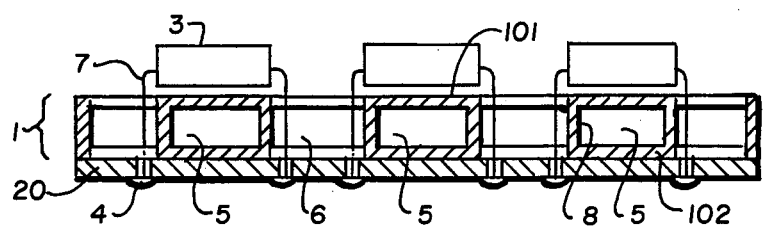
FIG. 2 a sectional view of another embodiment of the device according to the invention.
Figure 3:
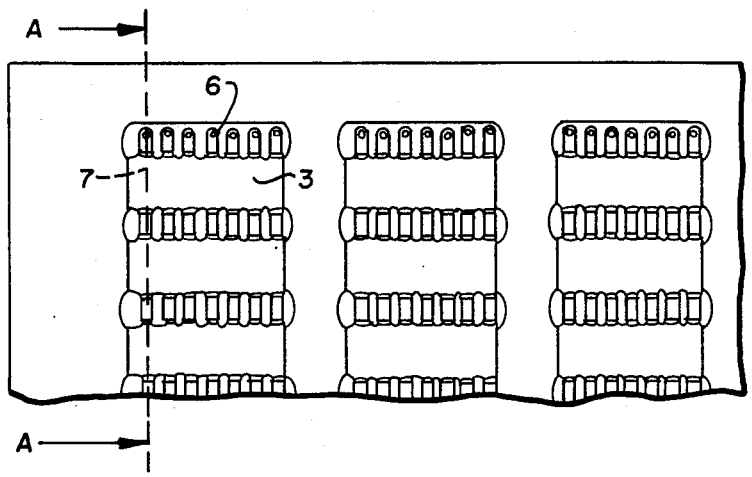
FIG. 3 a plan view of the device of FIG. 2.
Figure 4A:
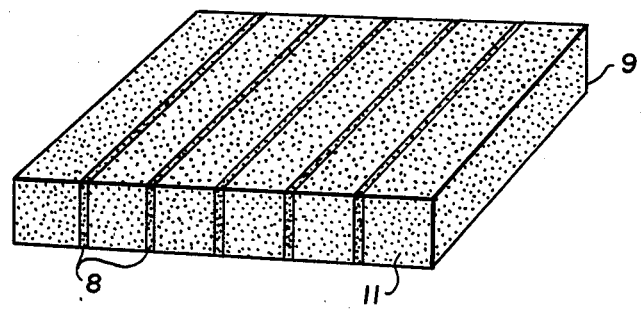
FIGS. 4a to 4d a process for producing the device of FIG. 1.
Figure 4B:
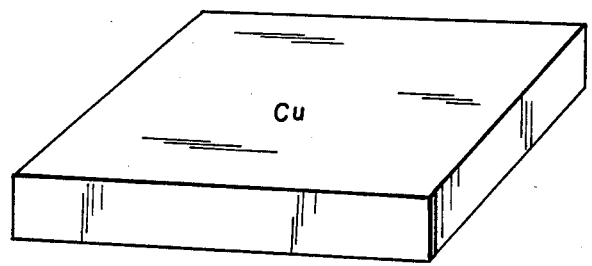
Figure 4C:
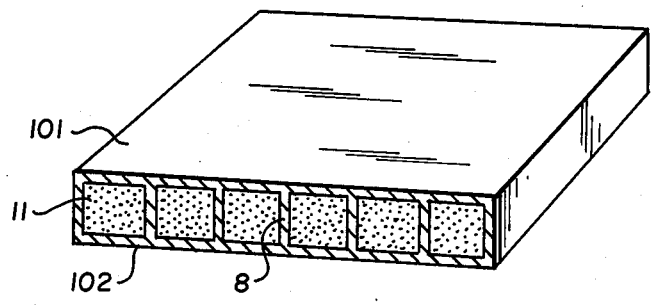
Figure 4D:
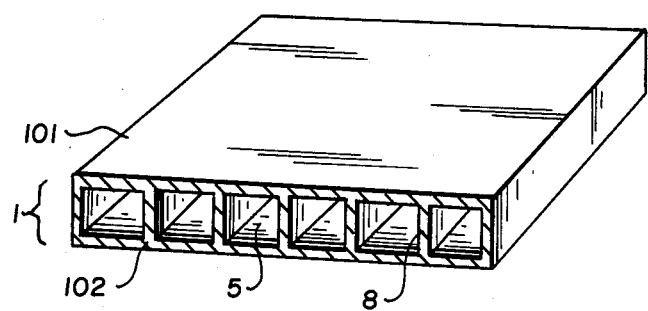

In the case of DIL packaging components, in which the latter pass through the printed circuit card, the cooling device differs slightly from that shown in FIGS. 2 and 3. Thus, it is necessary to form gaps level with the leads of said components.

FIG. 2 is a lateral sectional view of cooling device 1, on whose upper wall 101 are arranged components 3. The leads 7 of component 3 pass through the thickness of cooling device 1 within gap 6. FIG. 3 is a plan view of the device of FIG. 2.

The channels 5 in which circulates the cooling fluid are interrupted by gaps 6, which are formed level with the leads 7 of components 3 equipping card 20. The printed circuit card 20 is joined, by gluing or any other known means, to the bottom of the cooling device with respect to the components, the printed circuit being directed outwards. Therefore, component 3 is arranged astride the copper wall channel in which the gaseous or liquid cooling fluid flows and which is framed by the two gaps 6 corresponding to its leads 7.

Thus, leads 7 of components 3 traverse the cooling device by gaps 6 and card 20 by perforations provided in the printing circuit and are welded at 4 to the outside of device 1 from the other side of card 20.

The different phases in the production of the cooling device according to the invention are diagrammatically shown in FIGS. 4a to 4d and 5a to 5d corresponding to the process for producing the device respectively in the case of flat packaging components and in the case of DIL components traversing the printed circuit card.

The letter a in the drawing numbers designates the core preparation phase, letter b the electroforming phase, letter c the machining phase and letter "d" the core dissolving phase. Core 9 is made from a material such as e.g. wax, Woods metal or aluminium.

In the first case (FIG. 4a) the core is constituted by parallelepipedic bars 11 arranged in longitudinally juxtaposed manner and separated in pairs by copper partitions 8.

Figure 5A:
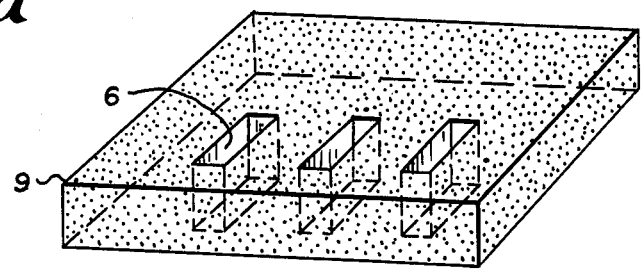
FIGS. 5a to 5d a process for producing the device of FIGS. 2 and 3.
Figure 5B:
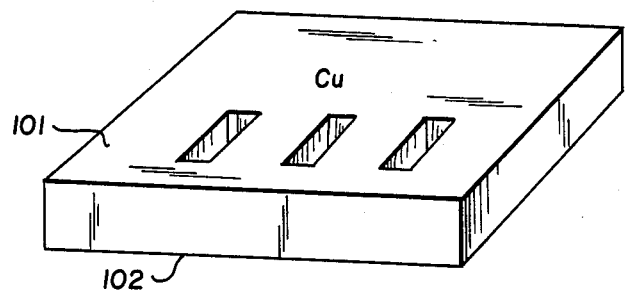
Figure 5C:
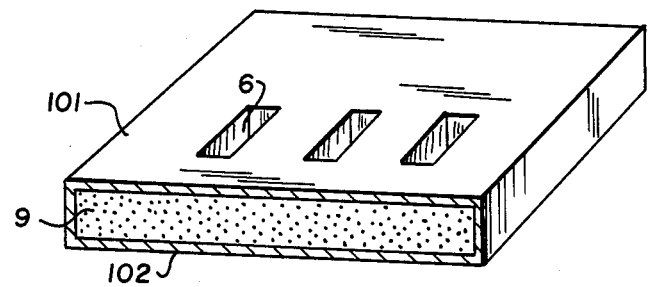
Figure 5D:
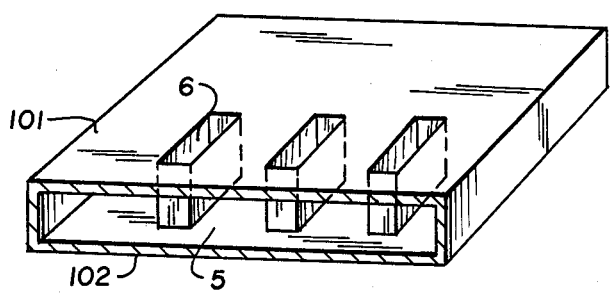

In the second case illustrated by FIG. 5a, core 9 is made in one piece with gaps 6 corresponding to the leads 7 of components 3, in the way in which they are to be installed, and completely traverse the thickness of core 9.

The second phase of the production process consists, in the first (FIG. 4b) and the second (FIG. 5b) case, covering the surface of the core, namely the upper face 101, lower face 102 and sides, as well as the side walls of gaps 6 (when they exist) with a thin copper coating by a per se known electroforming process.

The third phase of the production process consists in both the first (FIG. 4c) and in the second (FIG. 5c) cases, machining the front and rear lateral faces in order to remove the copper coating.

Finally, the fourth phase consists of eliminating the core which, as stated hereinbefore, is made from a material such as wax, whose melting point is well below that of copper. The process used in the fourth phase for dissolving the core is known and will not be described here.

The printed circuit card is then applied, by gluing or any other known process, to the thus obtained device, with the printed circuit visible on the outside.

Components 3 are then installed or implanted in the intended manner and in the way described at the start of the description.

The liquid or gaseous cooling fluid flows from one machine face to the other and drains the heat given off by components 3 as a result of an excellent heat exchange between the fluid and the components.

Thus, a cooling device for a printed circuit card and its production process have been described. The invention is more particularly usable in the case of airborne equipment.

What is claimed is:

1. A process for producing a cooling device for a printed circuit card, successively comprising the following steps:
   moulding a material with a melting point well below that of copper to form a core having lateral faces, an upper face and a lower face;
   applying a copper coating to the entire surface of said core by electroforming;
   machining two lateral faces of said copper coated core so as to remove copper;
   dissolving the core and forming a hollow copper frame wherein in said frame a cooling fluid is able to flow;
   fixing a printed circuit card to be cooled to a surface of said frame and deposited onto said upper face or said lower face of said core, the face of said card carrying a printed circuit, said face carrying said printed circuit being turned outwards.

2. A process according to claim 16, wherein before the electroforming step, gaps are made through said core from said upper face to said lower face, covering the lateral walls of said gaps with copper during said electroforming step, said gaps each being so that a tight channel is available, after the dissolving step, between the upper surface of the frame deposited onto said upper face of the core and the lower surface of the frame deposited onto said lower face of the core.

3. A process for producing a cooling device for a printed circuit card, wherein said process comprises the following successive steps:
   moulding a parallelepipedic core, said core having four lateral faces and two upper and lower faces, said core being made from a material having a melting point well below that of copper,
   applying a copper coating to the entire surface of said core by electroforming,
   machining a pair of two opposite lateral faces,
   dissolving the core,
   fixing the printed circuit card to be cooled to an upper or lower face, the face carrying the printed circuit being turned outwards; and
   installing the components on the card.

4. A process according to claim 3, wherein a plurality of copper partitions perpendicular to the upper and lower faces are incorporated into said core prior to said electroforming step.

5. A process according to claim 3, wherein gaps are made through said core during the moulding phase, said gaps being orthogonal to the upper and lower faces of said core, said gaps having lateral walls said lateral walls being covered with copper during the electroforming phase, said gaps being made in said core prior to said electroforming step.

6. A process according to claim 3, wherein before said electroforming step, a plurality of copper partitions perpendicular to said upper and lower faces of said core are incorporated into the core.

7. A process for producing a printed circuit card with a cooling device comprising the following steps:
   moulding a material with a melting point well below that of copper to form a core having lateral faces, an upper face and a lower face;
   applying a copper coating to the entire surface of the core by electroforming;
   machining two lateral faces of said copper coated core so as to remove copper;
   dissolving the core whereby a hollow copper frame is obtained wherein in said frame a cooling fluid is able to flow;
   fixing a first printed circuit card to be cooled onto the surface of said frame and deposited onto said upper face of said core, the face of said first card carrying the printed circuit being turned outwards;
   fixing a second printed circuit card to be cooled onto the surface of said frame and deposited onto said lower face of said core, the face of said second card carrying the printed circuit being turned outwards; and
   connecting flat packaging components to said first and second printed circuits.

8. A process for producing a printed circuit card with a cooling device comprising the following steps:
   moulding a material with a melting point well below that of copper to form a core having lateral faces, an upper face and a lower face;
   providing gaps through said core from said upper face to said lower face, said gaps having walls;
   applying a copper coating to the entire surface of the core and to the walls of said gaps by electroforming;
   machining two lateral faces of said copper coated core so as to remove copper;
   dissolving the core so as to leave a hollow copper frame wherein a cooling fluid is able to flow and gaps wherein the cooling fluid cannot flow, said frame having first and second surfaces;
   fixing a printed circuit card to a first surface of said frame and deposited onto said upper face or said lower face of said core, the face of said card carrying the printed circuit being turned outwards;
   positioning DIL packaging components having leads on a second surface of said frame and deposited onto said upper face or said lower face of said core which is not connected to said printed circuit card, said leads each passing through said frame within one of said gaps and being connected to said card.

* * * * *